US009415913B1

(12) United States Patent
Lanctuit et al.

(10) Patent No.: US 9,415,913 B1
(45) Date of Patent: Aug. 16, 2016

(54) COATED CONTAINER

(71) Applicant: NESTEC S.A., Vevey (CH)

(72) Inventors: Helene Beatrice Lanctuit, La Conversion (CH); Tran Minh Duc, Peynier (FR); Jocelyn Viard, Peynier (FR)

(73) Assignee: Nestec S.A., Vevey (CH)

( * ) Notice: Subject to any disclaimer, the term of this patent is extended or adjusted under 35 U.S.C. 154(b) by 0 days.

(21) Appl. No.: 15/035,041

(22) PCT Filed: Nov. 7, 2014

(86) PCT No.: PCT/EP2014/074012
§ 371 (c)(1),
(2) Date: May 6, 2016

(87) PCT Pub. No.: WO2015/067739
PCT Pub. Date: May 14, 2015

(30) Foreign Application Priority Data

Nov. 8, 2013 (EP) .................................... 13192159

(51) Int. Cl.
| | |
|---|---|
| *B65D 65/42* | (2006.01) |
| *C23C 16/34* | (2006.01) |
| *C23C 16/26* | (2006.01) |
| *C23C 16/02* | (2006.01) |
| *C23C 16/50* | (2006.01) |
| *B65D 85/804* | (2006.01) |

(52) U.S. Cl.
CPC ............ *B65D 65/42* (2013.01); *B65D 85/8043* (2013.01); *C23C 16/02* (2013.01); *C23C 16/26* (2013.01); *C23C 16/345* (2013.01); *C23C 16/50* (2013.01)

(58) Field of Classification Search
CPC .. B65D 65/42; B65D 85/8043; C23C 16/345; C23C 16/26; C23C 16/02; C23C 16/50
See application file for complete search history.

(56) References Cited

U.S. PATENT DOCUMENTS

2004/0076836 A1    4/2004   Beldi et al.

FOREIGN PATENT DOCUMENTS

| | | |
|---|---|---|
| EP | 0372696 | 6/1990 |
| WO | 0226401 | 4/2002 |

*Primary Examiner* — Michael C Miggins
(74) *Attorney, Agent, or Firm* — K&L Gates LLP

(57) ABSTRACT

The present invention relates generally to the field of polyolefin containers. One aspect of the invention is a polyolefin container coated with a gas barrier coating. In particular, the present invention relates to a polyolefin container coated with a gas barrier coating comprising a first layer of hydrogenated amorphous silicon nitride and a second layer of hydrogenated amorphous carbon. The hydrogenated amorphous silicon nitride layer may be deposited on the container, and the hydrogenated amorphous carbon layer may be deposited on the hydrogenated amorphous silicon nitride layer. A further aspect of the invention is a process for coating a polyolefin container comprising the steps of depositing a layer of hydrogenated amorphous silicon nitride on a polyolefin container by plasma-enhanced chemical vapor deposition and depositing a layer of hydrogenated amorphous carbon on the hydrogenated amorphous silicon nitride layer by plasma-enhanced chemical vapor deposition. A subject matter of the invention is the use of the polyolefin container coated with a gas barrier coating for the storage of food or beverage materials.

15 Claims, 1 Drawing Sheet

COATED CONTAINER

CROSS REFERENCE TO RELATED APPLICATIONS

The present application is a National Stage of International Application No. PCT/EP2014/074012, filed on Nov. 7, 2014, which claims priority to European Patent Application No. 13192159.5, filed Nov. 8, 2013, the entire contents of which are being incorporated herein by reference.

The present invention relates generally to the field of polyolefin containers. One aspect of the invention is a polyolefin container coated with a gas barrier coating. In particular, the present invention relates to a polyolefin container coated with a gas barrier coating comprising a first layer of hydrogenated amorphous silicon nitride and a second layer of hydrogenated amorphous carbon. The hydrogenated amorphous silicon nitride layer may be deposited on the container, and the hydrogenated amorphous carbon layer may be deposited on the hydrogenated amorphous silicon nitride layer. A further aspect of the invention is a process for coating a polyolefin container comprising the steps of depositing a layer of hydrogenated amorphous silicon nitride on a polyolefin container by plasma-enhanced chemical vapor deposition and depositing a layer of hydrogenated amorphous carbon on the hydrogenated amorphous silicon nitride layer by plasma-enhanced chemical vapor deposition. A subject matter of the invention is the use of the polyolefin container coated with a gas barrier coating for the storage of food or beverage materials.

Polyolefin polymers such as polyethylene and polypropylene are widely used in food packaging due to their lightness, low cost and flexibility. However, most polyolefin materials have low gas barrier properties, allowing oxygen or carbon dioxide molecules to easily penetrate packaging formed from polyolefins. For this reason, most plastic carbonated drink bottles are formed from polyethylene terephthalate (PET) rather than a polyolefin, as PET has much better gas barrier properties. As well as a need to keep gasses in the container, there may be a need to exclude gases, for example excluding oxygen can prevent a loss of quality due to oxidation of the container's contents.

One approach to increase the gas barrier properties of polyolefins is to laminate the polyolefin with other materials providing barrier properties. A polymer such as ethylene-vinyl alcohol (EVOH) provides a good oxygen barrier, but it is detrimentally affected by moisture and so must be sandwiched between other layers of material to protect it from moisture. To form containers such as boxes, bottles and capsules, a polyolefin polymer may be extruded together with a high oxygen barrier polymer and then blow-formed into a bottle or other container shape. However, multi-layer co-extrusion is relatively expensive, and containers formed from mixtures of plastics cannot easily be recycled, and so have a high environmental impact. Consumers are more and more concerned about recyclability and excess of packaging. At the same time, they are not ready to compromise on the product quality and convenience. There is therefore a need to provide a polyolefin container which has good gas barrier properties but which is predominantly a single polyolefin material and so can be more easily recycled.

Attempts have been made to apply a very thin layer of barrier material to plastic containers, for example by plasma coating. This has the advantage that the final coated container has a lower environmental impact due to the minimum consumption of barrier materials and the fact that it can be considered as a mono material and so can be more easily recycled. US2002/0179603 discloses a device that allows the internal or external face of a plastic bottle to be covered with a barrier coating. Hydrogenated amorphous carbon is used as a coating. Acceptable results have been obtained by plasma coating PET containers. However, polyolefin containers present a greater challenge, not just because of the higher permeability of the polymer, but also due to the poor adhesion and susceptibility to pin-holes and cracks in the coating when applied on a polyolefin surface.

US2004/0076836 proposes a gas barrier coating deposited on a polymer substrate by low pressure plasma. A barrier layer with a silicon oxide base is covered with a protective layer of hydrogenated amorphous carbon.

EP0372696 describes a method for depositing a nitride film onto a substrate, followed by a carbonaceous film. For example, a hydrophilic and abrasion-proof coating of a fluorine-containing carbonaceous film may be applied to the window of a vehicle, with a first silicon nitride film applied to protect the underlying surface from any undesirable caustic action of fluorine during deposition of the carbonaceous film.

WO02/26401 describes a method for the deposition of an internal coating in a plastic container, for example coating a mixture of polymeric carbon and silicon dioxide onto a thermoplastic material such as a polyolefin or a polyester.

WO2006/044254 describes a method for coating the inside surface of a polyolefin or a polylactic acid container to provide an effective barrier against gas transmission. Layers of polyorganosiloxane and silicon oxide (or amorphous carbon) are deposited.

EP2363511 discloses a film which has a silicon nitride layer deposited on its surface to act as a gas barrier. The silicon nitride layer is formed by plasma coating with gas mixtures such as silane gas, ammonia gas and hydrogen gas, or silane gas and nitrogen gas. EP2363511 does not disclose depositing hydrogenated amorphous carbon onto the silicon nitride layer, and does not propose coating an injection-moulded container. Films are generally easier to plasma coat successfully as the film can be readily transported through the plasma, with all areas of the film surface being equally exposed and coated. Three dimensional shapes such as containers present greater problems, with some areas of the container surface being less accessible than others.

EP2551216 describes a container with a plasma coated barrier layer. The container may be a container for coffee. The patent explains that in order to seal other components to the container, for example an internal filter or a membrane to close the container, the plasma coating is not applied to all the surface of the container. Masks are used to keep the sealing zones free of coating, otherwise an effective seal cannot be achieved. The need to mask areas of the container adds complexity to the coating process, and increases the risk of an incomplete barrier being formed, leading to leaks.

An object of the present invention is to improve the state of the art and to provide an improved polyolefin container coated with a gas barrier coating to overcome at least some of the inconveniences described above or at least to provide a useful alternative.

Any reference to prior art documents in this specification is not to be considered an admission that such prior art is widely known or forms part of the common general knowledge in the field. As used in this specification, the words "comprises", "comprising", and similar words, are not to be interpreted in an exclusive or exhaustive sense. In other words, they are intended to mean "including, but not limited to".

The object of the present invention is achieved by the subject matter of the independent claims. The dependent claims further develop the idea of the present invention.

Accordingly, the present invention provides in a first aspect a polyolefin container coated with a gas barrier coating comprising a first layer of hydrogenated amorphous silicon nitride and a second layer of hydrogenated amorphous carbon; the hydrogenated amorphous silicon nitride layer being deposited on the container, and the hydrogenated amorphous carbon layer being deposited on the hydrogenated amorphous silicon nitride layer. In a second aspect, the invention relates to a process for coating a polyolefin container comprising the steps of depositing a layer of hydrogenated amorphous silicon nitride on a polyolefin container by plasma-enhanced chemical vapor deposition and depositing a layer of hydrogenated amorphous carbon on the hydrogenated amorphous silicon nitride layer by plasma-enhanced chemical vapor deposition. A third aspect of the invention relates to the use of the polyolefin container of the invention for the storage of food or beverage materials.

The inventors surprisingly found that by coating a polyolefin container with a first layer of hydrogenated amorphous silicon nitride and a second layer of hydrogenated amorphous carbon they could achieve better gas barrier properties than by conventional coatings such as layers of silicon oxide. Multiple layers of film coating are conventionally applied to improve the gas barrier properties, each layer covering any tiny gaps left by the previous layer. A problem with this approach is that the thicker the final film coated layer, the more likely it is to crack and develop leaks. The inventors surprisingly found that with a first layer of hydrogenated amorphous silicon nitride and a second layer of hydrogenated amorphous carbon they could achieve a good gas barrier with a thin film. Having a thin barrier layer reduces problems of cracking and reduces barrier costs.

The invention provides a process for coating a polyolefin container comprising the steps:
a) depositing a layer of hydrogenated amorphous silicon nitride on a polyolefin container by plasma-enhanced chemical vapor deposition
b) depositing a layer of hydrogenated amorphous carbon on the hydrogenated amorphous silicon nitride layer by plasma-enhanced chemical vapor deposition.

The invention also relates to the use of a polyolefin container according to the invention.

Figure 1:
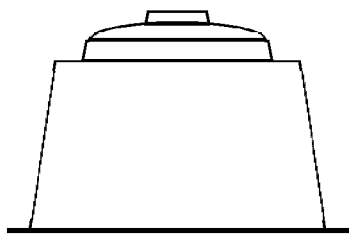
FIG. 1 is a side view drawing of a polypropylene capsule to be coated

In the scope of the current application, amorphous hydrogenated silicon nitride refers to amorphous compounds of silicon and nitrogen with the general formula $SiN_x$:H. The silicon nitride in the coating is not exactly stoichiometric, the value for x may vary between 0.5 and 1.5. The atomic concentration of hydrogen in the amorphous hydrogenated silicon nitride may be less than 20 at. %, for example less than 10 at. %, for further example less than 5 at. %.

Amorphous carbon is free, reactive carbon that does not have any crystalline structure. Amorphous carbon materials may be stabilized with hydrogen. Such materials are then called hydrogenated amorphous carbon, C:H. The polyolefin container of the invention may be coated with a gas barrier coating consisting of a first layer of hydrogenated amorphous silicon nitride and a second layer of hydrogenated amorphous carbon; the hydrogenated amorphous silicon nitride layer being deposited on the container, and the hydrogenated amorphous carbon layer being deposited on the hydrogenated amorphous silicon nitride layer. The atomic concentration of hydrogen in the hydrogenated amorphous carbon may be less than 20 at. %, for example less than 10 at. %, for further example less than 5 at. %. The hydrogenated amorphous carbon layer may be the outer layer of the coating. The hydrogenated amorphous carbon protects the coating from damage caused by abrasion.

The inventors were surprised to find that the gas barrier coating of the invention was able to provide good barrier properties at low thicknesses. The thickness of the coating can be measured by electron microscopy, for example bright field transmission electron microscopy (TEM-BF). The gas barrier coating of the invention may have a thickness of between 2 nm and 25 nm, for example between 3 nm and 20 nm, for further example between 6 nm and 15 nm. Where the container is coated on two sides, the thickness refers to the thickness of the coating on each side. Such thin layers do not have a detrimental effect on the recycling of the polyolefin and are less susceptible to cracking.

The polyolefin container may be coated on the inside, on the outside or both. Coating both inside and outside has the advantage of that if a section of the coating is damaged, for example by abrasion, then the gas barrier will be maintained by the coating on the other side of the container wall. Other components such as sealing membranes may be affixed directly to the gas barrier coating of the present invention, for example by ultrasonic sealing. This avoids the need to leave parts of the container uncoated to apply the sealing membrane. Having a complete coating reduces the risk of leaks, for example even a slight misalignment of a mask intended to leave an uncoated region for a sealing membrane could cause a leak. As the container needs to be held in position during the coating process, the contact points between the container and the fixing means will necessarily not be coated. These contact points should be designed to be small, and positioned on a part of the container where a gas barrier is either not required, or is provided in another way. For example the contact point might be on a flange around the neck of a bottle, or the contact point might be a small area within the region where a seal is to be applied. At least 99% of the internal surface and/or at least 99% of the external surface of the polyolefin container may be coated with the gas barrier coating.

The polyolefin container according to the invention may be formed by any of the methods well known in the art. For example it may be thermoformed, blow moulded, injection moulded or injection blow moulded. In particular, the polyolefin container according to the invention may be injection-moulded. Injection moulding consists of high pressure injection of a raw material, for example a polymer, into a mould which shapes the material into the desired shape. The material is usually heated before the high pressure injection and then cooled in the mould to solidify it. Injection moulding is the leading method of manufacturing wide mouth thermoplastic tubs, boxes and complex dimensional shapes. Because the part dimensions are completely controlled by the mould surfaces, injection moulding gives a dimensionally accurate part. Thin walled plastic containers can be manufactured, for example with wall thicknesses of around 0.15 mm.

The polyolefin forming the container of the invention may be polypropylene. Polypropylene is any homopolymer or copolymer in which propylene is the major component monomer. Polypropylene's inherent stiffness makes it ideal for thin walled packaging items. A high purity polypropylene can advantageously be used. This avoids low molecular weight additives migrating to the surface of the container and interfering with the application of the barrier coating. The polyolefin forming the container of the invention may be polypropylene homopolymer with a purity of at least 99% by weight. The polypropylene may have a semi-crystalline or crystalline structure.

The polyolefin container coated with a gas barrier coating of the invention may have a low permeability to oxygen. Excluding oxygen can be valuable in preventing degradation of the contents of a container. For example many foodstuffs undergo oxidation leading to undesirable color and flavor changes, and excluding oxygen can prevent growth of a number of food spoilage organisms. A polyolefin container coated with a gas barrier coating according to the invention may have an oxygen transfer rate of less than 0.02 $cm^3$ of oxygen per day at 1 bar pressure and 100% oxygen, for example less than 0.01 $cm^3$ of oxygen per day at 1 bar pressure and 100% oxygen, for further example less than 0.005 $cm^3$ of oxygen per day at 1 bar pressure and 100% oxygen. The oxygen transfer rate per $m^2$ of container surface may be less than 6 $cm^3$ of oxygen per day at 1 bar pressure and 100% oxygen, for example less than 3 $cm^3$ of oxygen per day at 1 bar pressure and 100% oxygen, for further example less than 2.5 $cm^3$ of oxygen per day at 1 bar pressure and 100% oxygen.

The polyolefin container according to the invention may be sealed by any method well known in the art and suitable for the type of container. For example, the container may be a yoghurt pot and a plastic-coated aluminum foil lid may be heat-sealed onto the opening of the pot, the container may be a tray such as a food tray, hermetically sealed with a film, or the container may be a bottle with a screw neck, and a lid may be screwed onto the bottle to close it. Such a lid will also need to have good gas barrier properties to protect the contents of the container, so for example a moulded polyolefin lid may also be coated with a gas barrier coating in a similar way to the container of the invention. The polyolefin container according to the invention may be closed by a membrane sealed to the container in a gas and moisture tight manner. Such membranes may be used to close an ingredient-containing capsule used in a beverage production machine, for example a NESCAFÉ® DOLCE GUSTO® pod. The membrane may have a low gas permeability, for example a multilayer film and/or a plasma coated film. The polyolefin container according to the invention may be selected from the group consisting of a bottle, a tray, a cup or a capsule. The polyolefin container according to the invention may be a rigid container.

One aspect of the invention is a process for coating a polyolefin container comprising the steps:

a) depositing a layer of hydrogenated amorphous silicon nitride on a polyolefin container by plasma-enhanced chemical vapor deposition
b) depositing a layer of hydrogenated amorphous carbon on the hydrogenated amorphous silicon nitride layer by plasma-enhanced chemical vapor deposition.

Plasma-enhanced chemical vapor deposition (PECVD) is a process used to deposit thin films from a gas state to a solid state on a substrate. Chemical reactions occur after creation of a plasma of the process gases. Plasma assisted chemical vapor deposition is an equivalent term to PECVD.

Plasma is a partially ionized gas containing ions, electrons, atoms, and neutral species. In order to excite and sustain excitation state, electrical energy must be applied to the plasma. The energy may be applied using a microwave signal, a radio frequency (RF) signal or a low frequency signal between two electrodes. The space between the electrodes is filled with the process gases. To enable the gas to be ionized in a controlled manner, the process is carried out under vacuum conditions.

PECVD permits energetic reactions at low temperatures (as low as 100° C. in some cases) as the plasma is formed by electrical ionization. This is an advantage over film coating techniques which form reactive gases using heat, such as combustion chemical vapor deposition or hot-wire chemical vapor deposition (also known as catalytic chemical vapor deposition). Heat can lead to deformation of the material being coated, which in turn may cause cracks in the coating layer. Heat may also cause degeneration of the material to be coated, such as depolymerization. In the process of the current invention, deposition may occur at a temperature below 130° C., for example at a temperature below 115° C. Compared to polymers such as polyethylene terephthalate (PET), polyolefins such as polypropylene are particularly sensitive to being deformed or damaged by high temperatures due to their low glass transition temperature and high thermal expansion.

The polyolefin container coated with a gas barrier coating may be obtainable by a process for coating a polyolefin container comprising the steps:

a) depositing a layer of hydrogenated amorphous silicon nitride on a polyolefin container by plasma-enhanced chemical vapor deposition
b) depositing a layer of hydrogenated amorphous carbon on the hydrogenated amorphous silicon nitride layer by plasma-enhanced chemical vapor deposition.

The layer of hydrogenated amorphous silicon nitride and the layer of hydrogenated amorphous carbon may be deposited in the same reactor chamber by changing the process gas between deposits, or the polyolefin container may be coated with hydrogenated amorphous silicon nitride in one reactor chamber and then transported to a second reactor chamber for the coating with hydrogenated amorphous carbon. The process may be operated as a continuous or semi-continuous process, for example by transporting the containers through the chambers sequentially, using a series of air-locks separating chambers containing different plasma gasses.

In the process of the invention, a single layer of hydrogenated amorphous silicon nitride and a single layer of hydrogenated amorphous carbon may be deposited. Conventionally it is expected that having only one or two PECVD layers on a film leads to pinholes in the coating whereas, by applying additional layers, any pinholes which may be present in a particular layer of coating will be covered by the overlapping and subsequent layers. However, the inventors were surprised to find that low gas permeability could be obtained with a single layer of hydrogenated amorphous silicon nitride and a single layer of hydrogenated amorphous carbon.

Different process gases may be used in a PECVD process to form silicon nitride, for example U.S. Pat. No. 5,508,067 describes a precursor gas mixture of hexamethyldisilazane, silane, ammonia and nitrogen. Such carbon containing gas mixtures lead to the incorporation of carbon atoms in the film which has been found to reduce the gas barrier properties of the film. Mixtures of silane, ammonia and nitrogen or silane, nitrogen and argon may be used to produce silicon nitride films by PECVD, but the inventors found that a mixture of silane and nitrogen gases gave particularly good results in the process of the present invention. The term silane is sometimes used to refer to the family of saturated hydrosilicon compounds but in the present specification the term silane refers to $SiH_4$. The hydrogenated amorphous silicon nitride layer may be deposited by plasma-enhanced chemical vapor deposition of a mixture of silane and nitrogen.

Different process gases may be used in a PECVD process to form amorphous carbon, for example mixtures of methane and argon, methane and nitrogen or ethyne and hydrogen. The inventors found that ethyne gas alone (no diluent gas) gave particularly good results in the process of the present invention. The hydrogenated amorphous carbon layer may be deposited by plasma-enhanced chemical vapor deposition of ethyne.

The process of the invention may further comprise pre-treating the polyolefin container with a plasma of argon before deposition of the hydrogenated amorphous silicon nitride layer. For example, the polyolefin container may be placed in a PECVD reactor which is then run with argon as the process gas. This pre-treatment cleans and activates the surface of the container which improves the quality of the subsequent coating.

The polyolefin container of the invention may be used for the storage of food or beverage materials. The storage life and quality of food and beverage materials can be improved by maintaining a modified atmosphere within container in which they are stored, or by excluding gasses such as oxygen from within the storage container. Polyolefin containers are widely used as food and beverage containers, but depending on the polyolefin used, have different inherent gas barrier properties. The coated polyolefin container of the invention, having good gas barrier properties, may beneficially be used to store food and beverage materials. For example, the polyolefin container of the invention may be used as a film-sealed food tray.

The polyolefin container of the invention may be used as a capsule to contain portioned ingredients for the preparation of a beverage by means of a beverage preparation machine. An example of such a capsule is a NESCAFÉ® DOLCE GUSTO® pod. Having good gas barrier properties, such as can be provided by the coated polyolefin capsule of the present invention, maintains the beverage ingredients in good condition. The coated container can be made from a single polyolefin, for example polypropylene. Mono material containers can be more easily recycled and so potentially have a lower environmental impact than containers where the gas barrier properties are achieved using multi-layer plastics.

Those skilled in the art will understand that they can freely combine all features of the present invention disclosed herein. In particular, features described for the product of the present invention may be combined with the process of the present invention and vice versa. Further, features described for different embodiments of the present invention may be combined. Where known equivalents exist to specific features, such equivalents are incorporated as if specifically referred to in this specification. Further advantages and features of the present invention are apparent from the figures and non-limiting example.

EXAMPLE

Coating Polypropylene Containers

Cup-shaped polypropylene containers were plasma coated in a PECVD apparatus by Coating Plasma Industrie, Peynier, France. The containers were injection-moulded from a polypropylene homopolymer (Borealis, Vienna) in the shape of an empty NESCAFÉ® DOLCE GUSTO® beverage capsule pod (FIG. 1) with a maximum diameter of 53 mm. The PECVD reactor was fitted with a 40 kHz generator, a 1000× 600 mm signal electrode and a 900×550 mm ground electrode. A Magnetron array was fixed below the ground electrode. There were two gas inlets; one fixed on the ground electrode and the other on the signal electrode.

Figure 2:
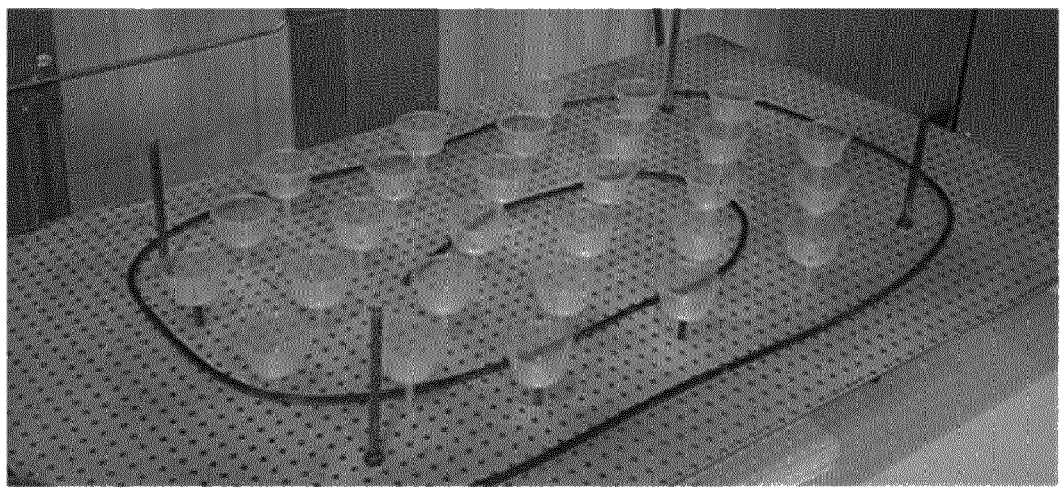
FIG. 2 is a photograph of the arrangement of capsules in the plasma-enhanced chemical vapor deposition apparatus

Capsules were coated using different deposition times. For each set of conditions, an array of 28 capsules was suspended from the signal electrode, spaced so as to be within approximately 7 cm of the ground electrode (FIG. 2). The reactor was evacuated to form a vacuum and then argon was flowed into the reactor at a flow rate of 1.0 standard liters per minute (slm). Plasma was generated for 10 s using a power of 1000 W. Once the argon had been purged from the reactor, the gas composition was changed to a mixture of $SiH_4$ (0.1 slm) and $N_2$ (2.0 slm) and a plasma was generated for the deposition time shown in table 1 using a power of 1000 W to deposit a layer of hydrogenated amorphous silicon nitride on the capsules. Once the silane/nitrogen had been purged from the reactor the gas composition was changed to $C_2H_2$ (0.4 slm) and a plasma was generated for the deposition time shown in table 1 using a power of 1000 W to deposit a layer of hydrogenated amorphous carbon.

Figure 3:
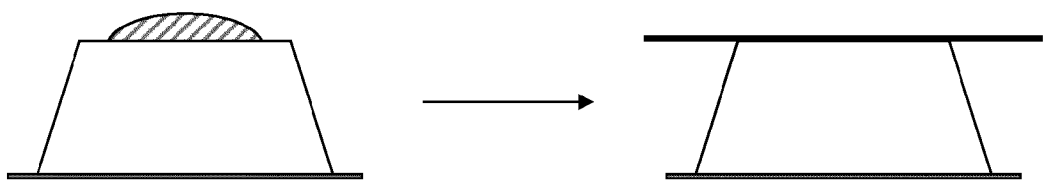
FIG. 3 is a drawing showing how capsules were prepared for oxygen transmission rate measurement The present invention relates in part to a polyolefin container coated with a gas barrier coating comprising a first layer of hydrogenated amorphous silicon nitride and a second layer of hydrogenated amorphous carbon; the hydrogenated amorphous silicon nitride layer being deposited on the container, and the hydrogenated amorphous carbon layer being deposited on the hydrogenated amorphous silicon nitride layer. Polyolefins (or polyalkenes) are polymers produced from simple olefins (also called alkenes) as monomer. Examples of polyolefins include polyethylene, polypropylene, polymethylpentene and poly(1-butene). A polyolefin container is a container whose material of construction predominantly comprises polyolefin. The size and shape of the container is not particularly limited, it may be for example a cup, a bottle, a tray, a box or a capsule. Gas barrier coatings are applied to materials such as plastics to reduce gas permeability.

The oxygen transmission rate (OTR) was then measured for two capsules from each set of conditions, one taken from the middle of the group and one from the edge. Two un-coated capsules were also measured. The OTR was measured using an OX-TRAN™ Model 2/61. The bottoms of the capsules were cut off and replaced by aluminum foil, glued to the capsules (FIG. 3). The measurement period was 72 hours at 23° C. (30-40% RH). Results are shown in table 1.

TABLE 1

| Sample | Treatment time | | | Middle OTR | Edge OTR |
|---|---|---|---|---|---|
| | Ar | $Si_xN_y$:H | C:H | | |
| Un-coated | — | — | — | 0.430 | 0.424 |
| A | 10s | 15s | 15s | 0.0141 | 0.0136 |
| B | 10s | 30s | 30s | 0.0061 | 0.0041 |
| C | 10s | 45s | 45s | 0.0092 | 0.0063 |

OTR results in $cm^3$/capsule/24 h 100% $O_2$

Under these conditions the best deposition time is 30 s. As the capsules had a wall surface area of 32.5 $cm^2$ (after cutting off the bottom as described above), the sample with 30 s deposition (B) taken from the middle of the group had an oxygen transfer rate of per $m^2$ of container surface of 1.8 $cm^3$ of oxygen per day at 1 bar pressure and 100% oxygen. Increasing the treatment time increases the film thickness, so it can be seen that once the film reaches a certain thickness, any further deposit is detrimental. An identical capsule coated by PECVD with multiple layers of polyorganosiloxane and silicon oxide (seven layers in total) was measured and found to have an OTR of 0.025 $cm^3$/pkg/24 h at 100% $O_2$. This demonstrates that, by coating a polyolefin container with a first layer of hydrogenated amorphous silicon nitride and a second layer of hydrogenated amorphous carbon, a better gas barrier can be achieved than by conventional coatings such as multiple layers of polyorganosiloxane and silicon oxide.

The invention claimed is:

1. A polyolefin container coated with a gas barrier coating comprising a first layer of hydrogenated amorphous silicon nitride and a second layer of hydrogenated amorphous carbon, the hydrogenated amorphous silicon nitride layer being deposited on the container, and the hydrogenated amorphous carbon layer being deposited on the hydrogenated amorphous silicon nitride layer.

2. A polyolefin container according to claim 1 wherein the gas barrier coating has a thickness of between 2 nm and 25 nm.

3. A polyolefin container according to claim 1 wherein at least 99% of the internal surface and/or at least 99% of the external surface of the polyolefin container is coated with the gas barrier coating.

4. A polyolefin container according to claim 1 wherein the container is injection-moulded.

5. A polyolefin container according to claim 1 wherein the polyolefin is polypropylene.

6. A polyolefin container according to claim 1 having an oxygen transfer rate per $m^2$ of container surface of less than 6 $cm^3$ of oxygen per day at 1 bar pressure and 100% oxygen.

7. A polyolefin container according to claim 1 wherein the container is closed by a membrane sealed to the container in a gas and moisture tight manner.

8. A polyolefin container according to claim 1 wherein the container is selected from the group consisting of a bottle, a tray, a cup and a capsule.

9. A process for coating a polyolefin container comprising the steps:
depositing a layer of hydrogenated amorphous silicon nitride on a polyolefin container by plasma-enhanced chemical vapor deposition; and
depositing a layer of hydrogenated amorphous carbon on the hydrogenated amorphous silicon nitride layer by plasma-enhanced chemical vapor deposition.

10. A process according to claim 9 wherein the hydrogenated amorphous silicon nitride layer is deposited by plasma-enhanced chemical vapor deposition of a mixture of silane and nitrogen.

11. A process according to claim 9 wherein the hydrogenated amorphous carbon layer is deposited by plasma-enhanced chemical vapor deposition of ethyne.

12. A process according to claim 9 further comprising pre-treating the polyolefin container with a plasma of argon before deposition of the hydrogenated amorphous silicon nitride layer.

13. A method of storing food or beverage comprising placing the food or beverage in a polyolefin container coated with a gas barrier coating comprising a first layer of hydrogenated amorphous silicon nitride and a second layer of hydrogenated amorphous carbon, the hydrogenated amorphous silicon nitride layer being deposited on the container, and the hydrogenated amorphous carbon layer being deposited on the hydrogenated amorphous silicon nitride layer.

14. A method for containing portioned ingredients for the preparation of a beverage by means of a beverage preparation machine comprising placing the ingredients in a polyolefin container coated with a gas barrier coating comprising a first layer of hydrogenated amorphous silicon nitride and a second layer of hydrogenated amorphous carbon, the hydrogenated amorphous silicon nitride layer being deposited on the container, and the hydrogenated amorphous carbon layer being deposited on the hydrogenated amorphous silicon nitride layer.

15. A method for providing a film-sealed food tray comprising using a polyolefin container coated with a gas barrier coating comprising a first layer of hydrogenated amorphous silicon nitride and a second layer of hydrogenated amorphous carbon, the hydrogenated amorphous silicon nitride layer being deposited on the container, and the hydrogenated amorphous carbon layer being deposited on the hydrogenated amorphous silicon nitride layer.

* * * * *